United States Patent
Pesquet-Popescu

(10) Patent No.: US 6,751,277 B1
(45) Date of Patent: Jun. 15, 2004

(54) FILTERING DEVICE

(75) Inventor: Béatrice Pesquet-Popescu, Bourg-la-Reine (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 672 days.

(21) Appl. No.: 09/624,649

(22) Filed: Jul. 25, 2000

(30) Foreign Application Priority Data

Jul. 27, 1999 (EP) ............................................. 99401919

(51) Int. Cl.[7] .......................... H04B 1/10; G06F 17/17; G06F 17/10
(52) U.S. Cl. ........................ 375/350; 708/313; 708/300
(58) Field of Search ................. 375/350; 708/300–313; 348/398; 382/240

(56) References Cited

U.S. PATENT DOCUMENTS

| | | | | |
|---|---|---|---|---|
| 5,629,737 A | * | 5/1997 | Menez et al. | 375/240.11 |
| 6,018,753 A | * | 1/2000 | Kovacevic et al. | 708/313 |
| 6,141,446 A | * | 10/2000 | Boliek et al. | 382/233 |
| 6,249,797 B1 | * | 6/2001 | Kovacevic et al. | 708/300 |

\* cited by examiner

*Primary Examiner*—Stephen Chin
*Assistant Examiner*—Cicely Ware

(57) ABSTRACT

The invention relates, in the field of subband decomposition, to the design of filter banks adapted to the input signal statistics. In most cases, two channel filter banks are iteratively applied over several levels of decomposition, the signals in the resulting subbands representing decimated and filtered versions of the input signal. According to the invention, it is proposed a perfect reconstruction critically decimated polyphase filter bank with a ladder structure, which adapts to the nonstationarities in the input signal. In the simplest embodiment, four steps are provided in the implementation of the filtering method: a splitting step (21), provided for subdividing the input signal $c_0(n)$ into two disjoint subsets $c_0(2n)$ and $c_0(2n+1)$ of samples (odd and even ones), a predicting step (22), provided for predicting on the basis of the even subset the odd one $(d_1(n)=c_0(2n+1)-P1[c_0(2n)]$, an updating step (23), provided for generating on the basis of said predicted odd subset the even one $(c_1(n)=c_0(2n)+U1[d_1(n)]$, and an iterative cross-optimization step associating said updating step (23) of the current decomposition level and the predicting step (32) of the following one. More generally, several successive similar scales may be provided, a minimization of the variance of the obtained coefficients being used as an optimization criterion at each scale.

4 Claims, 3 Drawing Sheets

FILTERING DEVICE

FIELD OF THE INVENTION

The present invention relates to a device for filtering an input sequence of digital signals, comprising:

(1) a first filtering stage, itself including:
  (A) a first splitting circuit, provided for subdividing the input sequence into two disjoint sets of samples, comprising respectively the odd samples $c_0(2n+1)$ and the even samples $c_0(2n)$ of said sequence
  (B) a first predicting circuit, provided for generating "detail" coefficients $d_1(n)=c_0(2n+1)-P1[\ldots, c_0(2n-2), c_0(2n), c_0(2n+2), \ldots]$, where P1 is a first linear filter and ($\ldots, c_0(2n-2), c_0(2n), c_0(2n+2), \ldots$) is the vector containing only the even samples of the input signal;
  (C) a first updating circuit, provided for generating "approximation" coefficients $c_1(n)=c_0(2n)+U1[\ldots, d_1(n-1), d_1(n), d_1(n+1), \ldots]$, where U1 is a second linear filter and ($\ldots, d_1(n-1), d_1(n), d_1(n+1), \ldots$) is the vector containing the "detail" coefficients;
(2) at least a second filtering stage, itself including:
  (D) a second splitting circuit, provided for subdividing the previously generated "approximation" vector into two disjoint sets of samples, similarly called $c_1(2n+1)$ and $c_1(2n)$;
  (E) a second predicting circuit, provided for generating a second level of "detail" coefficients $d_2(n)=c_1(2n+1)-P2[\ldots, c_1(2n-2), c_1(2n), c_1(2n+2), \ldots]$, where P2 is a third linear filter and ($\ldots, c_1(2n-2), c_1(2n), c_1(2n+2), \ldots$) is the vector of "detail" coefficients of even order resulting from the second splitting operation;
  (F) a second updating circuit, provided for generating a second set of "approximation" coefficients $c_2(n)=c_1(2n)+U2[\ldots, d_2(n-1), d_2(n), d_2(n+1), \ldots]$, where U2 is a fourth linear filter and ($\ldots, d2(n-1), d_2(n), d_2(n+1), \ldots$) is the following vector of "detail" coefficients.

This invention may be used in a wide range of signal processing applications, such as image and speech compression.

BACKGROUND OF THE INVENTION

Sub-band decomposition techniques are extensively used for data coding, for instance in signal processing applications like image and speech compression. Applied for example to image compression, they allow to perform a representation of the image information as a collection of sub-images appearing at different resolutions. A popular technique for carrying out such a decomposition is the well-known wavelet transform, that allows an original input signal to be described by a set of sub-band signals. Each sub-band represents in fact the original signal at a given resolution level and in a particular frequency range.

This decomposition into uncorrelated sub-bands is implemented by means of a set of monodimensional filter banks applied first to the lines of the current image and then to the columns of the resulting filtered image. An example of such an implementation is described in "Displacements in wavelet decomposition of images", by S. S. Goh, Signal Processing, vol. 44, no 1, June 1995, pp.27–38. Practically two filters—a low-pass one and a high-pass one—are used to separate low and high frequencies of the image. This operation is first carried out on the lines and followed by a sub-sampling operation, by a factor of 2. It is then carried out on the columns of the sub-sampled image, and the resulting image is also down-sampled by 2. Four images, four times smaller than the original one, are thus obtained: a low-frequency sub-image (or "smoothed image"), which includes the major part of the initial content of the concerned image and therefore represents an approximation of said original image, and three high-frequency sub-images, which contain only horizontal, vertical and diagonal details of said original image. This decomposition process continues until it is clear that there is no more useful information to be derived from the last smoothed image.

In the technical report "Building your own wavelets at home", by W. Sweldens and P. Schröder, Industrial Mathematics Initiative, Department of Mathematics, University of Seattle, Carolina, 1995, a new way to implement a very simple example of wavelet transform is described, the so-called Haar wavelet. Consider two numbers A and B as two successive samples of a sequence (A and B have therefore some correlation), a simple linear transform allows to replace them by their average S and their difference D:

$$S=(A+B)/2 \quad (1)$$

$$D=B-A \quad (2)$$

(if A and B are highly correlated, the expected absolute value of their difference is small and can be represented with few bits). When using such a linear transform, no information is lost, since A and B can always be reconstructed:

$$A=S-D/2 \quad (3)$$

$$B=S+D/2 \quad (4)$$

The above-given consideration is the key for understanding the Haar wavelet transform. Consider now a signal S[n] of $2^n$ sample values s[n, l]:

$$s[n]=s[n, l] \; 0 \leq l < 2^{n-1} \quad (5)$$

and apply the average and difference transform to each pair $A=s[2l]$ and $B=s[2l+1]$. There are $2^{n-1}$ such pairs (l=0, 1, 2, 3 ..., $2^{n-1}$). The results are the following:

$$s[n-1, l]=(s[n, 2l]+s[n, 2l+1])/2 \quad (6)$$

$$d[n-1, l]=s[n, 2l+1]-s[n, 2l] \quad (7)$$

The input signal s[n], which has $2^n$ samples, is split into two signals : s[n-1], with $2^{n-1}$ averages s[n-1, 1], and d[n-1], with $2^{n-1}$ differences d[n-1, 1], these averages and differences always allowing to recover the original signal S[n]. The averages can be seen as an approximation or a coarser representation of the original signal S[n], and the differences as the detail information needed to go from that coarser representation back to this original signal. If said original signal has some coherence (e.g. if the samples are values of a smoothly varying function), then the coarse representation closely resembles this original signal, the details being very small.

When applying iteratively the same transform to the coarser signal (by taking the average and difference), a coarser signal s[n-2] and another difference signal d[n-2], splitting s[n-1], are obtained. When repeating this operation n times, a Haar transform is implemented (that can be thought of as applying a N×N matrix (N=$2^n$) to the signal S[n]).

A new way of looking at the Haar transform, also called the "ladder" of lifting scheme, can then be presented, the novelty lying in the way the difference and the average of two numbers A and B can be computed. If one wants to compute the whole transform in-place—i.e. without using auxiliary memory locations, by overwriting the locations that hold A and B with the values of respectively S and D-, it cannot be done with the previous formulas (1) and (2): when using them and storing S and D in the same location as A and B respectively, it would lead to a wrong result.

Another implementation in two steps is preferred:
  first the difference D=B−A is computed and stored in the location for B (which is therefore lost, thus preventing from computing directly S=A+B);
  B being lost, the average is then found by using A and the newly computed difference D, according to the formula S=A+D/2 which gives the same result, and this result is stored in the location for A.

The advantage of such a splitting into two steps is that it is possible to overwrite B with D and A with S without requiring any auxiliary storage. This particular scheme can be described in more detail. Consider a signal S[j] with $2^j$ samples, which has to be transformed into a coarser (or "approximation") signal S[j−1] and a "detail" signal D[j−1]. A typical case of a wavelet transform built through the above scheme (see the technical report previously cited) consists of three steps, each of which is described in more detail, in relation with FIG. 1:

a splitting step SPL: the signal S[j] is divided, in a splitting stage 11, into two disjoint subsets of samples, one group consisting of the even indexed samples s[2l] and the other one consisting of the odd indexed samples s[2l+1] (this splitting into even and odd samples is called the Lazy wavelet transform). The following operator can therefore be built:

$$(\text{even } [j-1], \text{odd } [j-1]) = \text{split}[s[j]] \quad (8)$$

a predicting step PRED: if the signal S[j] has a local correlation structure, these even and odd subsets are highly correlated, which allows to predict, in a predicting stage 12, one of the two sets with a reasonable accuracy if the other one is given (in the present case, the even set is always used to predict the odd one: an odd sample s[j, 2l+1] uses its left neighbouring even sample s[j, 2l] as its predictor, for determining the difference d[j−1, l]=s[j, 2l+1]−s[j, 2l] between the odd sample and its prediction). More gene other subband transforms can be implemented using a prediction of the odd samples based only on the previous even ones. Denoting by P the prediction operator, the detail signal is then obtained as the difference between the actual odd sample, at the output of the splitting stage 11, and its prediction, at the output of the predicting stage 12, and can be written:

$$d[j-1] = \text{odd}[j-1] - P[\text{even}[j-1]] \quad (9)$$

where "even" represents all even samples previous to j−1.

an updating step UPD: one of the key properties of the coarser signals is that they have the same average value as the original signal, i.e. the quantity $$S = 2^{-j} \sum_{l=0}^{2^j-1} s[j, l] \quad (10)$$

is independent of j, which has for result that the last coefficient s[0,0] is the DC component or overall average of the signal. The updating step, carried out in an updating stage 13, ensures this by letting:

$$s[j-1, l] = s[j, 2l] + d[j-1, l]/2 \quad (11)$$

Substituting this definition, it can easily be verified that:

$$\sum_{l=0}^{2^{j-1}-1} s[j-1, l] = \sum_{l=0}^{2^{j-1}-1} (s[j, 2l] + d[j-1, l]/2) = \quad (12)$$

$$1/2 \sum_{l=0}^{2^{j-1}-1} (s[j, 2l] + s[j, 2l+1]) = 1/2 \sum_{l=0}^{2^j} s[j, l]$$

which allows to define an operator U of the form:

$$s[j-1] = \text{even}[j-1] + U[d[j-1]] \quad (13)$$

In the case of the Haar transform, U[d[j−1]] is simply (d[j−1])/2. More complicated updating operators exist for other subband transforms.

The subtractor and the adder are designated by the references 14 and 15. All these computations are made in-place: the even locations can be overwritten with the averages and the odd ones with the details. A C-like implementation of these computations may be given by:

(odd[j−1], even[j−1]):=Split (s[j])

odd[j−1]−=P(even[j−1])

even[j−1]+=U(odd[j−1])

It has then been shown that any linear wavelet transform can be implemented with such kind of scheme, where the scale transition is achieved by applying a second predict/update stage to s and d signals, thus constituting a filter bank. An important characteristic of the filter bank which is employed should be the maximization of the energy compaction of the input, which drastically influences the final coding gain. In this context, efforts have been made on the design of filter banks that are optimally adapted to the input signal statistics.

These filter banks are generally non-varying decompositions, which act in the same way whatever the input image. It then appeared as possible to design adaptive filters, changing with the varying characteristics of the input, but, till now, only the first step of these schemes was adapted to changing input, such as described for instance in "Linear/nonlinear adaptive polyphase subband decomposition structures for image compression", by ö.N. Gerek and A. E. Cetin, Proceedings of the 1998 IEEEE International Conference on Acoustics, Speech and Signal Processing, vol.III, May 12–15, 1998, Seattle, Wash. (USA), pp. 1345–1348.

SUMMARY OF THE INVENTION

It is therefore an object of the invention to propose, with respect to such an implementation, an optimized adaptive filtering device, allowing a complete adaptation to varying characteristics of the input.

To this end, the invention relates to a device such as defined in the introductive paragraph of the description and which is moreover characterized in that the first updating circuit U1 and the second predicting circuit P2 are associated within an iterative cross-optimization operation carried out by using the second filter U1 for optimizing the third filter P2 and then said third filter P2 for optimizing said second filter U1.

The advantage of this structure, adapted to the non-stationarities in the input signal, is that it preserves the perfect reconstruction property, without respect of the filters employed in each concerned pair of filtering stages. This is a major advantage in image coding schemes, because lossless coding is achieved.

Preferably, the iterative optimization operation aims at minimizing the variance of the detail coefficients at the output of each decomposition level. The efficiency of the encoding operation of each detail sub-band is indeed increased if its variance has been minimized. At the last level, the optimization aims at minimizing the variance of the approximation coefficients.

BRIEF DESCRIPTION OF THE DRAWINGS

The particularities and advantages of the invention will now be explained with reference to the embodiment described hereinafter and considered in connection with the drawings, in which.

DETAILED DESCRIPTION OF THE INVENTION

Figure 2:
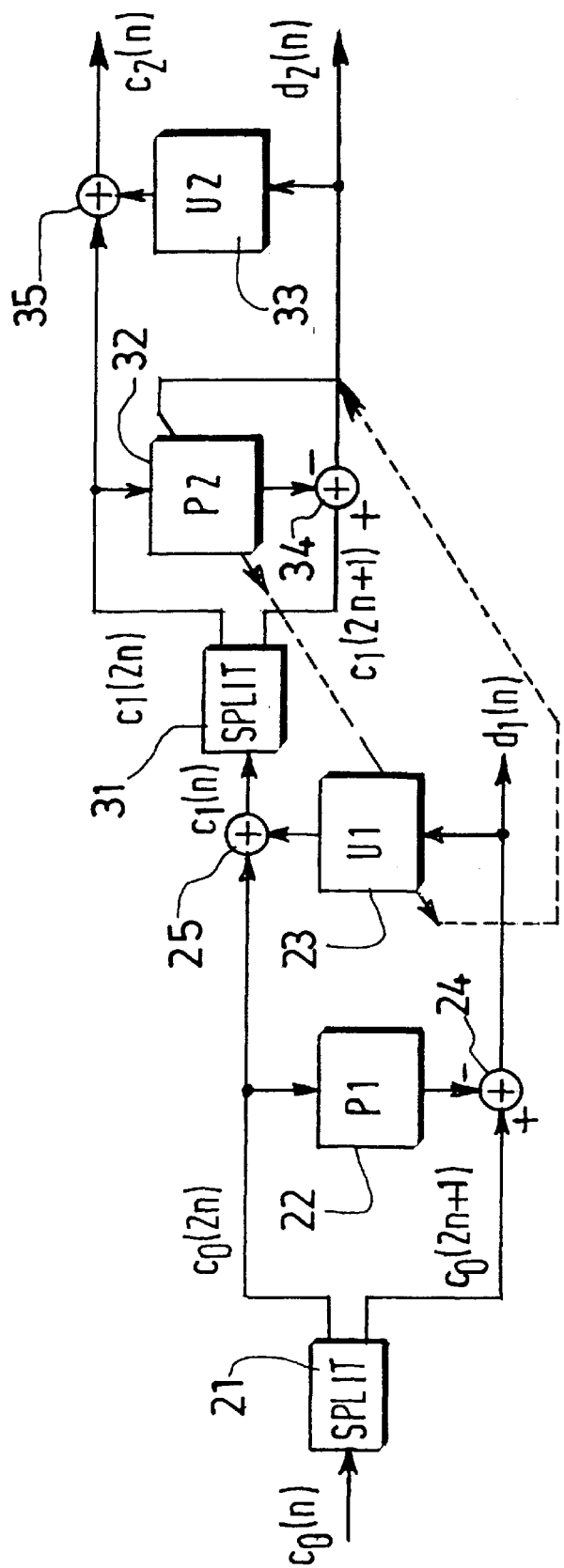
FIG. 2 illustrates an implementation of an adaptive filter bank according to the invention.

An embodiment of a device for the implementation of the method according to the invention is illustrated in FIG. 2. This device is for instance described in the case the input signal is the sequence of the 2J successive digital samples corresponding to an image. This input signal has then the following form (L being the luminance):

$$IS[j]=L[j], \text{ with } j=1, 2, \ldots, 2J \quad (14)$$

Figures 1, 3:
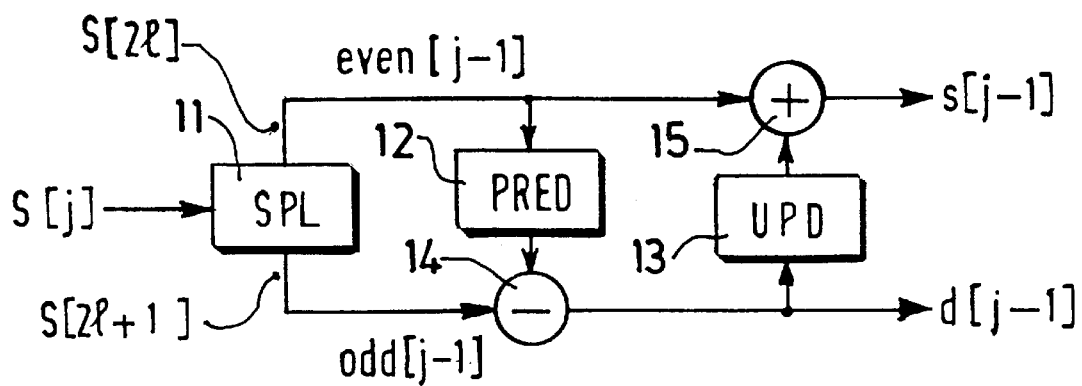
FIG. 1 illustrates an embodiment of a filter bank using the known ladder (lifting) scheme.
FIG. 3 illustrates a subdivision of an original image into two sets of samples forming a quincunx grid.

The first step of the method is carried out by a splitting circuit 21, provided for subdividing the input signal IS[j], consisting of successive samples $c_0(n)$, into two disjoint sets of samples. The first set comprises the J odd samples of IS[j], and the second one comprises its J even samples. Such a subdivision into two sets of samples, applied to an input image, is shown in the quincunx grid of FIG. 3 where the crosses correspond to the odd samples and the circles to the even ones. The two outputs of the splitting circuit 21 are referenced $c_0(2n)$ and $c_0(2n+1)$, where $c_0(2n)$ denotes an even sample of the input signal and $c_0(2n+1)$ represents an odd sample.

The second step is carried out by a predicting circuit 22, provided for generating a "detail" vector $d_1(n)$ according to the following equation:

$$d_1(n)=c_0(2n+1)-P1[\ldots, c_0(2n-2), c_0(2n), c_0(2n+2), \ldots], \quad (15)$$

where a filtering operator P1 is applied to $[\ldots, c_0(2n-2), c_0(2n), c_0(2n+2), \ldots]$, the vector containing only the even samples of the input signal. With the assumption that P1 is a linear filter, the relation (15) becomes:

$$d_1(n) = c_0(2n-2k) \sum_{k=-K}^{k=+K} p_1(k) \cdot c_0(2n-2k) \quad (16)$$

where $p_1(k)$, $k \in [-K, \ldots, \ldots, +K]$ are the coefficients of the P1 filter.

This filter P1 can be iteratively optimized in order to minimize the variance of $d_1(n)$. The coefficients of the filter P1 are therefore updated, using the values of the "detail" coefficients computed at the previous iteration, which gives, for the iteration (i+1):

$$p_1(k)^{(i+1)} = p_1(k)^{(i)} - \frac{\mu}{2} \frac{\partial [d_1(n)^2]}{\partial p_1(k)} \bigg|^i \quad (17)$$

This also means:

$$P1(k)^{(i+1)}=P1(k)^{(i)}+\mu.d_1(n)^{(i)}.c_0(2n-2k) \quad (18)$$

The third step is carried out by an updating circuit 23, provided for generating the "approximation" coefficients $c_1(n)$ obtained from the following equation:

$$c_1(n)=c_0(2n)+U1[\ldots, d_1(n-1), d_1(n), d_1(n+1) \ldots], \quad (19)$$

(where $[\ldots, d_1(n-1), d_1(n), d_1(n+1) \ldots]$ is the vector of "detail" coefficients and $U_1$ is also assumed to be a linear filter). The subtraction needed in order to obtain $d_1(n)$ and the addition needed in order to obtain $c_1(n)$ are carried out in a subtractor 24 and an adder 25 respectively.

As U1 is a linear filter, the equation (19) can be written as follows:

$$c_1(n) = c_0(2n) + \sum_{k=-K}^{k=+K} u_{1(k)} \cdot d_1(n-k) \quad (20)$$

where $u_1(k)$, $k \in [-K, \ldots, \ldots, K]$ are similarly the coefficients of the U1 filter.

The circuits 21 to 25 form the first decomposition level. At a second decomposition level, implemented in similar circuits 31 to 35, the "detail" coefficients $d_2(n)$ are obtained according to the equation:

$$d_2(n)=c_1(2n+1)-P2[\ldots, c_1(2n-2), c_1(2n), c_1(2n+2), \ldots] \quad (2)$$

where $[\ldots, c_1(2n-2), c_1(2n), c_1(2n+2), \ldots]$ is the vector of "detail" coefficients of even order resulting from the splitting operator action in the circuit 31.

As P2 is considered to be a linear filter, one has:

$$d_2(n) = c_1(2n+1) - \sum_{k=-K}^{k=+K} p2(k) \cdot c_1(2n-2k) \quad (22)$$

From the equation (20), one deduces:

$$c_1(2n+1) = c_0(4n+2) + \sum_{k=-K}^{k=+K} u_1(k) \cdot d_1(2n+1-k) \quad (23)$$

and:

$$c_1(2n-2k) = c_0(4n-4k) + \sum_{l=-K}^{l=+K} u_1(l) \cdot d_1(2n-2k-l) \quad (24)$$

Combining the equations (22) to (24), one obtains an equation showing the dependence of $d_2$ on U1 and P2:

$$d_2(n) = c_0(4n+2) + \sum_{k=-K}^{k=+K} u_1(k) \cdot d_1(2n+1-k) - \sum_{k=-K}^{k=+K} p_2(k) \cdot \left[ c_0(4n-4k) + \sum_{l=-K}^{l=+K} u_1(l) \cdot d_1(2n-2k-l) \right] \quad (25)$$

The applicant has considered that, for a fixed filter U1, the expression (25) is linear in the coefficients of P2, while, for a fixed filter P2, the expression is linear in the coefficients of U1, and has proposed, according to the invention, to carry out an iterative cross-optimization allowing to determine the coefficients of the two circuits 23 and 32 (i.e. of the two filters U1 and P2).

Figure 4:
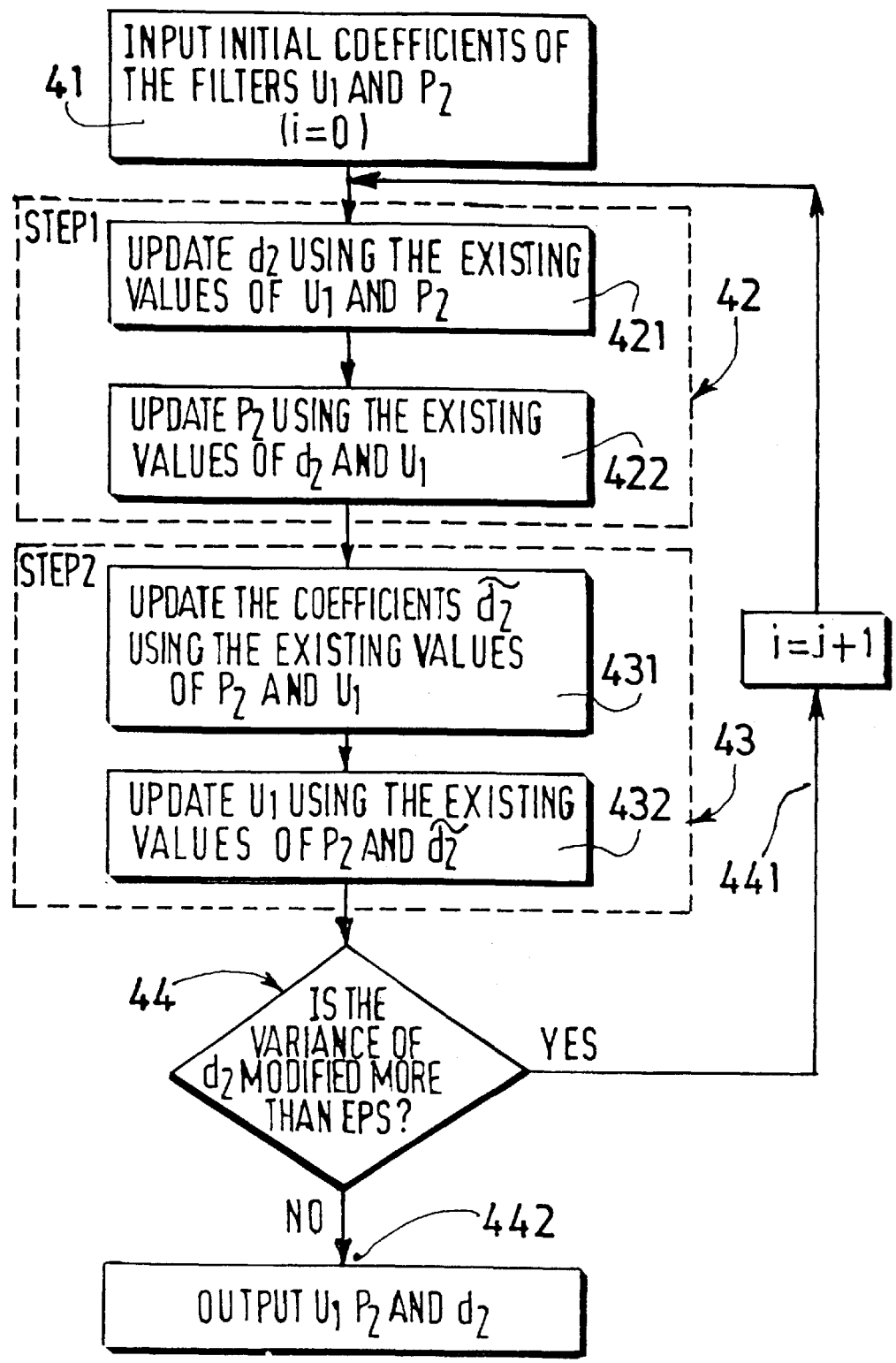
FIG. 4 illustrates the cross-optimization process according to the invention.

This cross-optimization process, illustrated in FIG. 4, is realized with a gradient-descent algorithm in which, at each iteration, the previously determined values of the coefficients of U1 are used to optimize P2 and these new found values of the coefficients of P2 are in turn used to optimize U1 (this is illustrated in FIG. 2 by means of the arrows in dotted lines).

The steps in FIG. 4 are the following:
(a) initialization, referenced 41, of the coefficients of the filters U1 and P2 (i=0);
(b) several iterations:
(1) a first sub-step, referenced 42, comprises the following operations:
(i) $d_2$ is updated using the existing values of the coefficients of P2 and U1 (operation 421), which leads to the coefficients denoted by $d_2(n)^{(i)}$;
(ii) P2 is updated (operation 422) using the existing values of d2 and U1, i.e. $p_2^{(i+1)}$ (=the coefficients to be determined during an iteration (i+1)) is updated using the values $u_1^{(i)}$, $p_2^{(i)}$ computed during the previous iteration and $d_2^{(i)}$ computed in the same iteration in the operation 421:

$$p_2(k)^{(i+1)} = p_2(k)^{(i)} - \frac{\mu}{2} \frac{\partial [d_2(n)^2]}{\partial p_2(k)} \bigg|^i \quad (26)$$

(where $\mu$ is the adaptation step), which allows to obtain, by developing the expression (26):

$$p_2(k)^{(i+1)} = \quad (27)$$

$$p_2(k)^{(i)} + \mu d_2(n)^{(i)} \cdot \left[ c_0(4n-4k) + \sum_{l=-K}^{l=K} u_1(l)^{(i)} \cdot d_1(2n-2k-l) \right]$$

(2) a second sub-step, referenced 43, allows to update $u_1^{(i+1)}$ using the values $p_2^{(i+1)}$ computed in the previous step 42 and comprises to this end the following operations:
(i) $\tilde{d}_2$ (=the "detail" coefficients at the second level of decomposition, computed using $u_1^{(i)}$ and $p_2^{(i+1)}$) is updated using the existing values of the coefficients of P2 and U1 (operation 431), which leads to the coefficients denoted by $\tilde{d}_2(n)^{(i)}$;

(ii) U1 is updated (operation 432) using the existing values of P2 and $\tilde{d}_2$, i.e. $u_1^{(i+1)}$ is updated using the values $p_2^{(i+1)}$ and $\tilde{d}_2(n)^{(i+1)}$ previously computed. The equation corresponding to this second step is:

$$u_1^{(i+1)}(k) = u_1(k)^{(i)} - \frac{\mu}{2} \frac{\partial [d_2(n)^2]}{\partial u_1(k)} \bigg|^i \quad (28)$$

which leads to the expression:

$$u_1^{(i+1)}(k) = \quad (29)$$

$$u_1(k)^{(i)} - \mu \tilde{d}_2(n)^{(i)} \cdot \left[ d_1(2n+1-k) - \sum_{l=-K}^{l=K} p_2(l)^{(i+1)} \cdot d_1(2n-2l-k) \right]$$

This optimization procedure is stopped when the variance of the "detail" coefficients $d_2$ is not modified more than a predefined threshold epsilon (EPS) between two successive iterations. The comparison to this threshold is carried out by the circuit 44 of FIG. 4. If said variance is modified more than this threshold EPS, then the optimization procedure continues (next iteration indicated by the connection 441), until the variance of the "detail" coefficients is no more modified by more than eps. In this case, the final values of $d_2$ and of the coefficients of U1 and P2 are now available (connection 442).

For the last decomposition level, the optimization of the updating circuit (of the circuit 33 in case of two filtering stages only) is carried out independently, by considering as optimization criterion the minimization of the variance of the "approximation" coefficients of this last level, given by:

$$c_2(n) = c_1(n) + U2[\ldots, d_2(n-1), d_2(n), d_2(n+1), \ldots] \quad (30)$$

As U2 is a linear filter, one has:

$$c_2(n) = c_1(n) + \sum_{k=-K}^{k=K} u_2(k) \cdot d_2(n-k) \quad (31)$$

Using the value of $c_1(n)$, one obtains:

$$c_2(n) = c_0(n) + \sum_{k=-K}^{k=K} u_1(k) \cdot d_1(2n-2k) + \sum_{k=-K}^{k=K} u_2(k) \cdot d_2(n-k) \quad (32)$$

The equations describing the gradient-descent algorithm are then as follows (iteration (i+1)):

$$u_2(k)^{(i+1)} = u_2(k)^{(i)} - \frac{\mu}{2} \frac{\partial [c_2(n)^2]}{\partial u_2(k)} \quad (33)$$

which finally gives:

$$u_2(k)^{(i+1)} = u_2(k)^{(i)} - \mu \cdot c_2(n)^{(i)} \cdot \sum_{k=-K}^{k=K} d_2(n-k) \quad (34)$$

where $c_2(n)^{(i)}$ are the output coefficients computed at the i-th iteration by taking into account the values $u_2(k)^{(i)}$.

What is claimed is:

1. A device for filtering an input sequence of digital signals, comprising:
   (1) a first filtering stage, itself including:
      (A) a first splitting circuit, provided for subdividing the input sequence into two disjoint sets of samples, comprising respectively the odd samples $c_0(2n+1)$ and the even samples $c_0(2n)$ of said sequence;
      (B) a first predicting circuit, provided for generating "detail" coefficients $d_1(n)=c_0(2n+1)-P1[\ldots, c_0(2n-2), c_0(2n), c_0(2n+2), \ldots]$, where P1 is a first linear filter and $(\ldots, c_0(2n-2), c_0(2n), c_0(2n+2), \ldots)$ is the vector containing only the even samples of the input signal;
      (C) a first updating circuit, provided for generating "approximation" coefficients $c_1(n)=c_0(2n)+U1[\ldots, d_1(n-1), d_1(n), d_1(n+1), \ldots]$, where U1 is a second linear filter and $(\ldots, d_1(n-1), d_1(n), d_1(n+1), \ldots)$ is the vector containing the "detail" coefficients;
   (2) at least a second filtering stage, itself including:
      (D) a second splitting circuit, provided for subdividing the previously generated "approximation" vector into two disjoint sets of samples, similarly called $c_1(2n+1)$ and $c_1(2n)$;
      (E) a second predicting circuit, provided for generating a second level of "detail" coefficients $d_2(n)=c_1(2n+1)-P2[\ldots, c_1(2n-2), c_1(2n), c_1(2n+2), \ldots]$, where P2 is a third linear filter and $(\ldots, c_1(2n-2), c_1(2n), c_1(2n+2), \ldots)$ is the vector of "detail" coefficients of even order resulting from the second splitting operation;
      (F) a second updating circuit, provided for generating a second set of "approximation" coefficients $c_2(n)=c_1(2n)+U2[\ldots, d_2(n-1), d_2(n), d_2(n+1), \ldots]$, where U2 is a fourth linear filter and $(\ldots, d_2(n-1), d_2(n), d_2(n+1), \ldots)$ is the following vector of "detail" coefficients; characterized in that the first updating circuit and the second predicting circuit are associated within an iterative cross-optimization operation carried out by using the second filter U1 for optimizing the third filter P2 and then said third filter P2 for optimizing said second filter U1.

2. A filtering device according to claim 1, characterized in that said iterative cross-optimization operation is carried out by using as optimization criterion the minimization of the variance of the "detail" coefficients at each scale from the second one to the last one.

3. A filtering device according to claim 1, characterized in that the first prediction circuit is optimized by using as optimization criterion the minimization of the variance of the "detail" coefficients $d_1$ at the first scale.

4. A filtering device according to claim 1, characterized in that, at the last scale N, the last updating circuit $U_N$ is optimized by using as optimization criterion the minimization of the variance of the "approximation" coefficients at this last scale.

* * * * *